United States Patent [19]

Hillman et al.

[11] 4,281,031
[45] Jul. 28, 1981

[54] METHOD AND APPARATUS FOR PROCESSING WORKPIECES

[75] Inventors: Gary Hillman, Livingston; Michael J. Devico, Madison, both of N.J.

[73] Assignee: Machine Technology, Inc., Whippany, N.J.

[21] Appl. No.: 60,337

[22] Filed: Jul. 25, 1979

[51] Int. Cl.³ .................... B05D 3/14; B05B 15/06
[52] U.S. Cl. .................... 427/45.1; 134/1; 219/10.55 R; 219/10.55 A; 427/314; 427/58
[58] Field of Search ............. 427/45.1, 46, 299, 314; 134/1; 219/10.55 R, 10.55 A, 10.55 C, 10.55 F; 15/21 E, 74, 77

[56] References Cited

U.S. PATENT DOCUMENTS

| | | | |
|---|---|---|---|
| 3,457,894 | 7/1969 | David | 15/77 |
| 3,479,222 | 11/1969 | David et al. | 15/21 E |
| 3,803,660 | 4/1974 | Jividen et al. | 15/77 |
| 3,898,411 | 8/1975 | Smeets | 219/10.55 R |
| 4,062,463 | 12/1977 | Hillman et al. | 15/21 E |
| 4,123,306 | 10/1978 | Landry | 219/10.55 R |

*Primary Examiner*—John H. Newsome
*Attorney, Agent, or Firm*—Lerner, David, Littenberg & Samuel

[57] ABSTRACT

An arrangement is provided for performing a plurality of processes on workpieces, such as silicon wafers, while they remain at a single processing station. The processing operations include scrubbing, coating, developing, and/or baking the wafer without removing it from a work support at the work station. The apparatus includes a transferring device for automatically transferring the wafer from a cassette to a work support. In addition, positioned about the centrally-located work support is a scrubbing device for scrubbing the wafer and a liquid dispensing device for dispensing liquid on the wafer. Each is movable into and out of position over the work support. In addition, the work support is surrounded by a microwave chamber for baking the wafer while it remains on the work support.

22 Claims, 6 Drawing Figures

METHOD AND APPARATUS FOR PROCESSING WORKPIECES

FIELD OF THE INVENTION

The present invention relates generally to a method and apparatus for performing a number of processes on a workpiece while it is positioned at the same station, and specifically to an improved arrangement wherein a silicon wafer may be scrubbed, baked, coated, and/or developed while it remains at a single processing station.

BACKGROUND OF THE INVENTION

In the processing of semiconductor materials for the ultimate manufacture of integrated circuits and the like, a number of steps must be performed on silicon wafers. Typically, such processing of the silicon wafer includes scrubbing the wafer to clean it and then baking it, and/or coating the wafer and then baking it, and/or developing the wafer and then baking it. In addition, such processes are typically performed by transferring the wafer to a plurality of different work stations or machines, each of which have the capacity for performing only one of these functions. For example, the wafers may be cleaned in a scrubber and then transferred to a separate apparatus for baking. Then, the wafers may again be transferred to another apparatus for coating with dopant and then returned to the baking apparatus. Similarly, the wafers may be transferred to a developing location, and then returned to the baking apparatus.

As will be understood, such processing which requires the transferring of the wafers to a plurality of different work stations is time consuming, costly, and inefficient. It would therefore be highly desirable to provide an arrangement wherein all of the necessary processes to be performed on the wafer can be performed on the wafer while it is positioned at a single location or station, which would avoid all of the transferring oprations between each different process which are now required. In addition, it would also avoid the need for the costly apparatus for transferring the workpieces between the various work stations or machines.

With respect to the baking operation presently being performed to bake the silicon wafers, such arrangements typically include a conveyor which moves the wafer through an oven so that the wafer, which may or may not be microwave heated, is baked as it moves through the oven. Such an arrangement requires a relatively large apparatus and complex conveyor arrangement which allows the wafer to be baked as it traverses the oven. Accordingly, it would also be highly desirable to avoid the need for such a large and complex apparatus to bake the silicon wafers.

Broadly, it is an object of the present invention to provide an improved arrangement which overcomes one or more of the aforesaid problems. Specifically, it is within the contemplation of the present invention to provide an arrangement wherein all of the processing functions to be performed on a silicon wafer, including scrubbing, coating, developing, and/or baking, can be performed at a single work station and thereby avoid the need for transferring the silicon wafer between a plurality of different work stations in order to complete its processing.

It is a further object of the present invention to provide an improved processing apparatus for silicon wafers which processes such wafers in a highly-efficient manner by reducing the time it takes to perform such operations and by substantially reducing the complexity of the apparatus required.

It is a still further object of the present invention to provide an improved arrangement for baking of silicon wafers wherein the wafers are maintained at a single station while they are being baked and otherwise processed.

SUMMARY OF THE INVENTION

Briefly, in accordance with the principles of the present invention, an improved arrangement is provided for performing a plurality of processes on workpieces, such as silicon wafers. More particularly, in accordance with the present invention, a plurality of different operations may be performed on a silicon wafer at a single station. For example, the silicon wafer may be scrubbed and baked at the same station, or it may be coated and baked at the same station, or it may be developed and baked at the same station, or it may go through any combination of these operations at the same station, such as a cycle which would include scrubbing, baking, coating, and baking again at the same station.

Advantageously, as a result of the present invention, all of such operations in any desired sequence may be performed on a silicon wafer while it is at a single work station. This is accomplished by depositing the silicon wafer to be processed on a centrally-located work support, such as a chuck. The chuck is surrounded by a microwave chamber which can be opened and closed relative to the chuck so that the wafer can be deposited on the chuck for baking or removed therefrom after baking. In addition, the other apparatus necessary for processing the workpiece or wafer at this work station are positioned about the periphery of the centrally-located chuck. For example, the scrubbing apparatus is positioned to one side of the chuck so that the scrubbing chamber and cleaning brush can be moved into position over the chuck to scrub and clean the wafer, and then retracted so that the microwave chamber can be closed to bake the silicon wafer. In addition, the dispenser for coating or developing the silicon wafer is also positioned about the periphery of the centrally-located chuck. The dispenser includes a movable nozzle which is moved into position over the chuck to dispense the coating or developing material on the wafer and is then retracted from its position over the chuck, so that the microwave chamber can be closed to bake the silicon wafer.

In order to insert silicon wafers on the chuck and remove them from the chuck after they have been processed, the apparatus of the present invention may also be provided with a cassette-receiving station for receiving a cassette containing a plurality of workpieces or wafers to be processed. A work-transfer arm is operatively associated with the cassette and movable between a retracted position and the chuck for sequentially transferring each of the workpieces from its position within the cassette to the chuck for processing, and for sequentially returning each of the workpieces from the chuck to the cassette after all of the processing operations on each workpiece have been completed.

In the preferred embodiment, the microwave chamber includes a lower fixed cover for enclosing and surrounding the chuck and workpiece, and an upper movable cover which moves into and out of engagement with the lower cover to open and close the microwave chamber for baking of the silicon wafer disposed on the chuck.

Advantageously, as a result of the present invention, there is provided an arrangement for performing a plurality of processing steps on a workpiece, such as a silicon wafer, while it remains at a single processing station. Accordingly, as a result of the present invention, complex and costly transferring apparatus for transferring the workpieces between a plurality of different work stations has been eliminated. In addition, as a result of the present invention, microwave baking of the silicon wafer can be performed at a single station, without moving the wafer through a large and costly microwave chamber for baking.

BRIEF DESCRIPTION OF THE DRAWINGS

Further objects, features, and advantages of the present invention will become apparent upon the consideration of the following detailed description of a presently preferred embodiment when taken in conjunction with the accompanying drawings, wherein.

DETAILED DISCUSSION OF PREFERRED EMBODIMENTS OF THE PRESENT INVENTION

Figure 1:
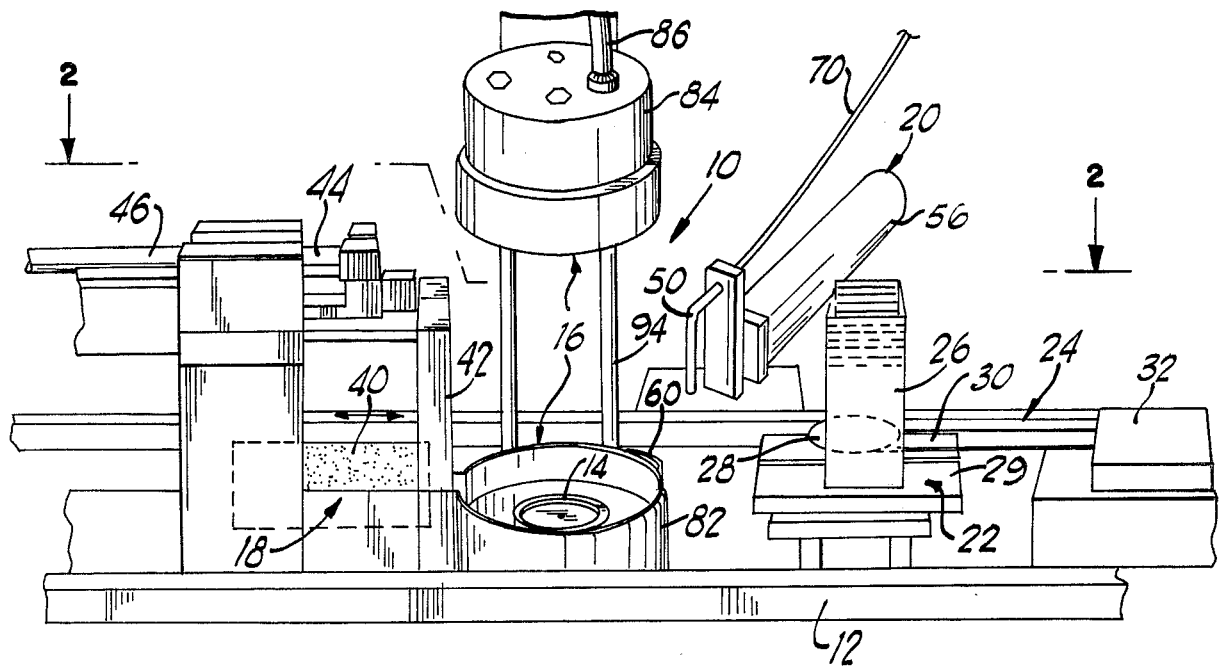
FIG. 1 is a perspective view illustrating the centrally-located chuck for supporting a workpiece surrounded by a plurality of different types of processing apparatus.

Referring now to FIG. 1, there is shown the improved apparatus of the present invention, generally designated by the reference numeral 10, which includes a supporting frame 12, a centrally-located work-support station or chuck 14, microwave baking apparatus 16, wafer-scrubbing apparatus 18, dispensing apparatus 20, cassette-receiving station 22 for receiving a cassette 26, and wafer-transferring apparatus 24 for transferring wafers 28.

The wafer-transferring apparatus 24 includes a wafer-supporting arm 30 fixedly attached to a movable carrier 32 and a drive mechanism (not shown) for moving arm 30 between a retracted position and an extended position over the chuck 14. Reference is made to U.S. Pat. No. 4,062,463 for a detailed explanation of the apparatus for actuating transfer arm 30 to move between its retracted and extended positions relative to the cassette 26, and its disclosure is incorporated herein. As explained in that patent, transfer arm 30 includes a recessed portion at the end thereof for supporting a wafer 28, and also includes a pneumatic sensor formed therein for sensing the receipt and removal of a wafer.

Cassette-receiving station 22 includes an elevator mechanism (not shown) for moving cassette 26 containing the silicon wafers 28 in a vertical direction so that the wafers can be sequentially removed from the cassette as it indexes downwardly. The elevator mechanism includes a platform 29 on which the cassette is adapted to be locked into position so that it is movable therewith. The platform is connected to a drive mechanism which is movably mounted on a screw-threaded rod which is rotated by a suitable motor. Again, reference is made to U.S. Pat. No. 4,062,463 for a complete description of this apparatus, and its disclosure is incorporated herein.

As will be understood, the transferring apparatus 24 operates in the following manner to deposit a wafer 28 on chuck 14 to begin its sequence of processing operations. When the cycle begins, wafer-supporting arm 30 is in its retracted position, cassette 26 is mounted on the platform 29 and is ready to have its lowermost silicon wafer 28 withdrawn therefrom, chuck 14 is in its lowermost position, the scrubbing apparatus 18 and the dispensing apparatus 20 are in their retracted positions, and microwave baking apparatus 16 is opened. Then wafer-supporting arm 30 is moved from its retracted position through the cassette 26 so that the lowermost silicon wafer 28 in the cassette is deposited in the recess formed on the wafer-supporting arm 30. As the wafer-supporting arm 30 continues to move in its forward direction, the silicon wafer 28 is brought into position over chuck 14 to be deposited thereon. The chuck 14, which is vertically movable and rotated by a motor (not shown) via shaft 15, is then moved upwardly to lift the silicon wafer off of the wafer-supporting arm 30, thereby breaking the vacuum of the pneumatic sensor. In addition, chuck 14 is provided with an internal vacuum duct 14a which operates to hold the silicon wafer 28 in position thereon while it is being processed. The wafer-supporting arm 30 is then moved to its retracted position, and chuck 14 moves downwardly so that the scrubbing cycle, dispensing cycle, and/or microwave baking cycle can then start.

Figure 2:
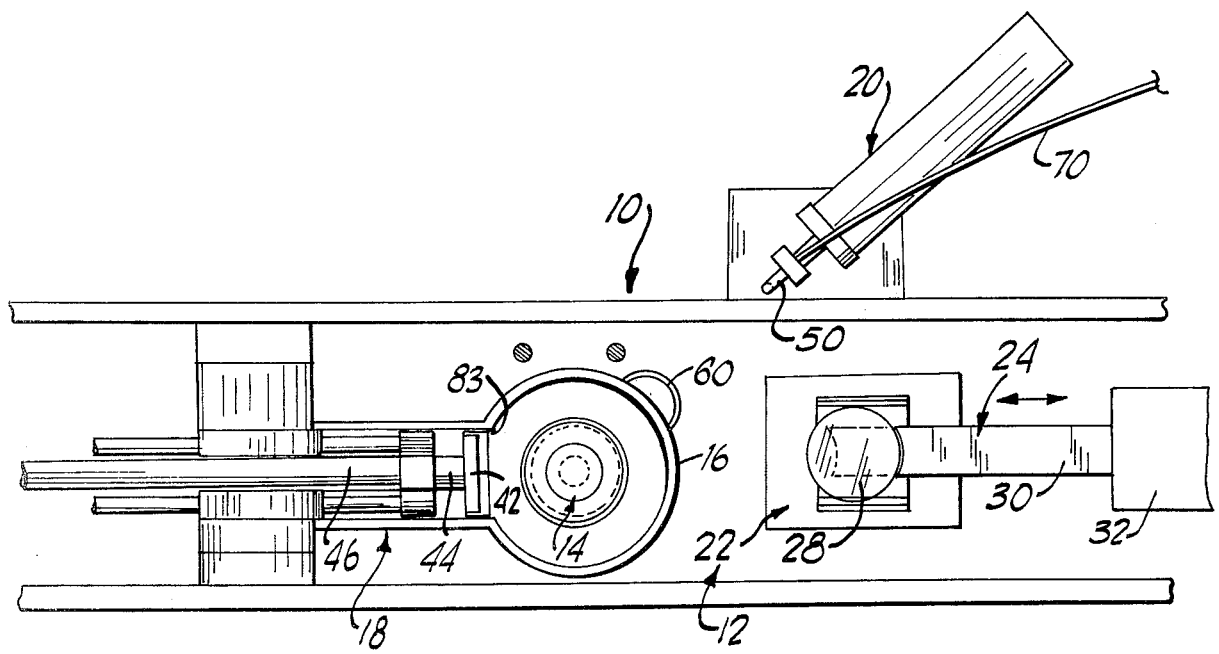
FIG. 2 is a plan view of the apparatus illustrated in FIG. 1.
Figure 3:
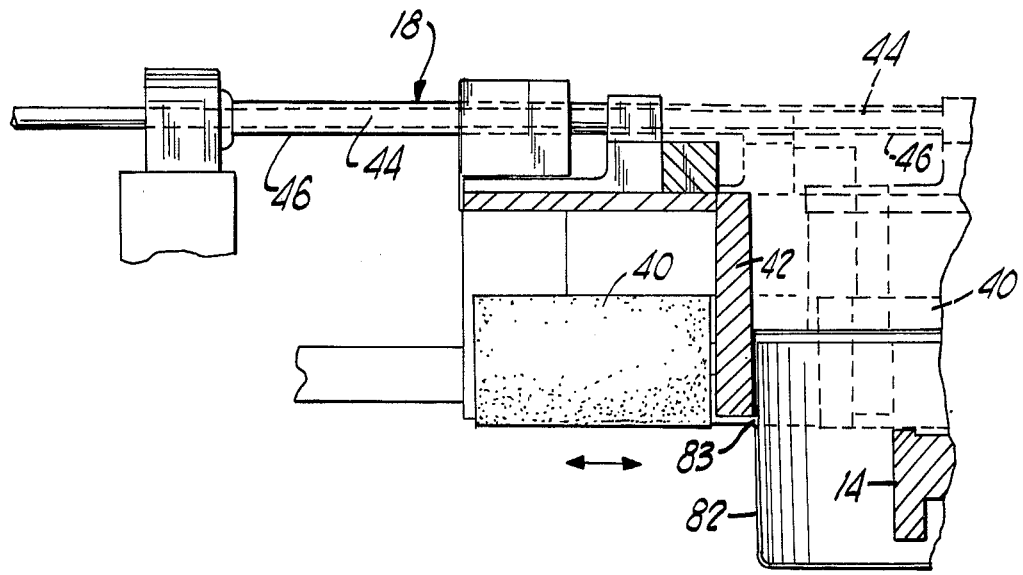
FIG. 3 is a detailed illustration of the scrubbing apparatus employed in the present invention.

Referring to FIGS. 2 and 3, the details of the scrubbing apparatus 18 are clearly shown. Scrubbing apparatus 18 includes a rotary brush 40 mounted on a housing 42 which is moved by a piston 44 controlled by a pneumatic cylinder 46. As shown, the lower section 82 of microwave apparatus 16 is provided with an opening 83 for allowing housing 42 to move from its retracted position to its scrubbing position over chuck 14 so that brush 40 can scrub the silicon wafer mounted thereon. During the scrub cycle, the chuck 14 and the silicon wafer 28 to be scrubbed rotate together. Detergent and water are then injected into the housing 42 so that as the brush 40 rotates, the silicon wafer is scrubbed. The housing 42 and brush 40 are then retracted, and the silicon wafer is rinsed with water by a suitable rinsing hose (not shown) mounted in lower section 82. As chuck 14 continues to rotate, the silicon wafer 28 is spin dried and is then ready to be further processed, such as a baking operation, or it can be returned to cassette 26.

Figure 4:
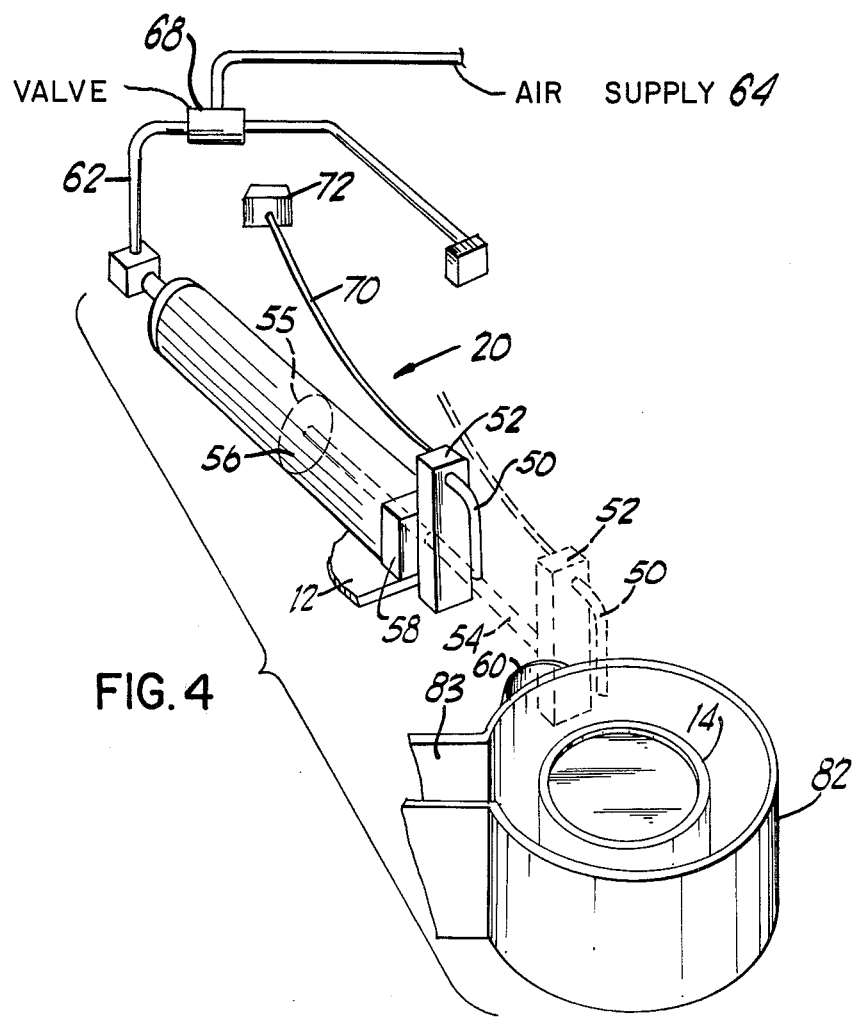
FIG. 4 is a detailed view of the dispensing apparatus employed in the present invention.

Referring now to FIG. 4, the movable dispenser 20 employed in the present invention is clearly shown. The movable dispenser 20 is used to dispense a fixed amount of a certain type of liquid on the surface of the silicon wafer. For example, in the manufacture of integrated circuits, a dopant material is dispensed onto the silicon wafer and then baked. Additionally, in the manufacture of printed circuit components, a photoresist material may be dispensed onto a substrate before the substrate is photoetched and baked. In such operations, a fixed amount of liquid is dispensed by the movable dispenser and deposited on the surface of the workpiece and is then spread uniformly thereon by spinning of the workpiece at a high rate of speed. In the present case, this is accomplished by rotating chuck 14 at a high rate of speed after the liquid is dispensed on the workpiece. The exact amount of dispensed liquid is not critical.

However, it is critical that after the liquid is dispensed, no further drops of the liquid drip onto the surface. This is accomplished by the movable dispenser 20 of the present invention.

More particularly, the movable dispenser 20 includes a nozzle 50 which extends through an aperture in a block 52. The block 52 is connected to piston rod 54 of a double-acting air cylinder 56. Air cylinder 56 is mounted in a conventional manner by a bracket 58 on the frame 12. A reservoir 60 for capturing drops from nozzle 50 is mounted external to the microwave chamber. When the movable dispenser 20 is in its dispensing position, the end of nozzle 50 from which liquid is dispensed is approximately centered over chuck 14. When the dispensing apparatus is in its retracted position, the end of the nozzle 50 is disposed over reservoir 60.

Referring now to FIG. 4, the operation of the dispensing apparatus 20 will be briefly described. Air cylinder 56 is a double-acting cylinder having an internal piston 55 dividing the cylinder into a left side air chamber and a right side air chamber, with the piston 55 being connected to piston rod 54. When air under pressure is introduced into the left side air chamber, the piston and piston rod is caused to move toward the right, thereby extending nozzle 50 to its dispensing position. When air under pressure is introduced into the right side air chamber, piston rod 54 is caused to move to the left, thereby moving nozzle 50 to its retracted position. The air line 62 is connected to an air supply 64 through a four-way solenoid valve 68.

Nozzle 50 is connected to a liquid supply by a line 70 and an on-off valve 72, so that when the valve is opened, liquid from the supply is dispensed through the nozzle 50, and when the valve is closed, dispensing is terminated.

Accordingly, when it is desired to dispense liquid from nozzle 50 onto the workpiece, dispense nozzle 50 is moved to its extended position over the center of chuck 14. Then the valve for dispensing liquid is opened for a fixed period of time in order to dispense the desired amount of liquid. At the end of this fixed period of time, the dispensing valve is closed, and substantially simultaneously, the dispensing nozzle 50 is retracted from its position over chuck 14 to its position over the reservoir 60. Therefore, any further drops of the liquid are captured by the reservoir. Preferably, the liquid supply valve 72 actually stops dispensing liquid, just before the nozzle is moved from its position over the chuck. A more complete and detailed description of the operation of the movable dispensing apparatus is provided in Application Ser. No. 858,516, filed Dec. 8, 1977, now U.S. Pat. No. 4,190,015 and such disclosure is incorporated herein by reference. It is also noted that chuck 14 is caused to spin at a relatively low speed in order to spread the dispensed liquid uniformly over the workpiece. Chuck 14 is then caused to spin at a high speed. The workpiece is then ready to be baked by the microwave heating apparatus 16, in a manner to be described.

Figure 6:
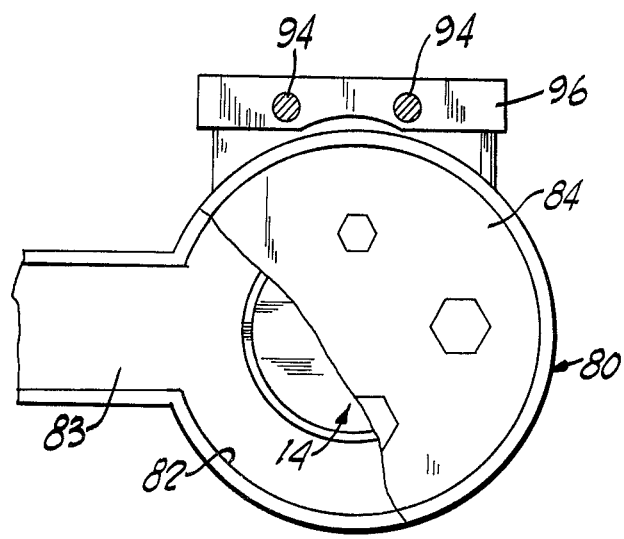
FIG. 6 is a plan view of the microwave apparatus.
Figure 5:
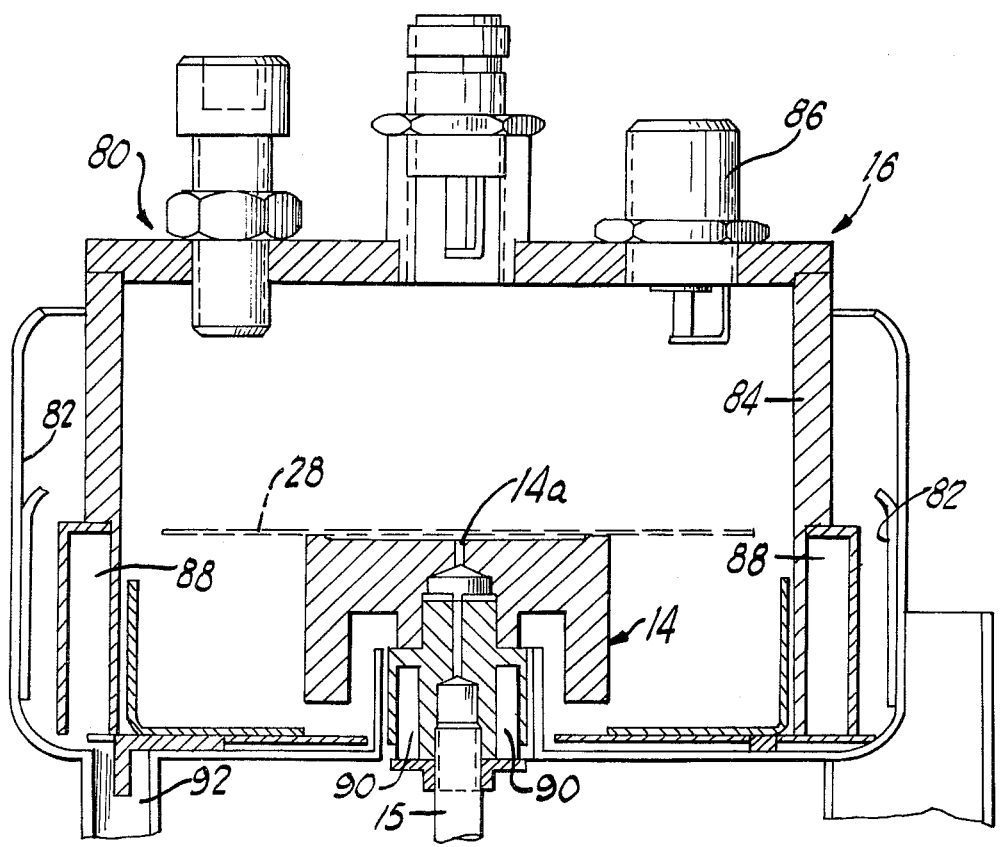
FIG. 5 is a detailed view of the microwave chamber employed in the present invention.

Referring now to FIGS. 5 and 6, the microwave heating apparatus 16 is shown in detail. More particularly, disposed around chuck 14 is microwave chamber 80 to be used in baking a workpiece or silicon wafer disposed on chuck 14. The microwave chamber 80 includes a lower stationary section 82 and an upper movable section 84 which reciprocates vertically to open and close the microwave chamber. The upper section 84 includes suitable inlets 86 for supplying microwave radiation to the inside of microwave chamber 80. In addition, suitable microwave chokes are provided, such as choke 88 which is annular in configuration and is formed on the bottom of movable section 84. In addition, an annular-shaped choke 90 is also provided to seal the microwave cavity adjacent the chuck 14. The stationary section 82 includes an opening 92 formed along its bottom so that any liquid collected in the chamber during processing of the silicon wafer can be removed therefrom. As shown in FIG. 6, upper microwave section 84 moves between its open and closed position by sliding on rods 94 which pass through block 96 connected to microwave section 84.

In operation, the microwave chamber is closed to bake the wafer disposed on chuck 14, and in the preferred embodiment, the chuck rotates during baking to reduce hot spots. This baking process may be performed after the scrubbing step or after a dispensing and spinning operation. After the baking operation, the microwave chamber is opened, and the wafer may be removed from the chuck.

When processing of the wafer has been completed, the vacuum on the chuck is broken so that the wafer may be removed therefrom, and chuck 14 is returned to its upper position. Then, wafer-supporting arm 30 is moved to its extended position, and the chuck is moved downwardly. As chuck 14 moves downwardly, it deposits the scrubbed or processed wafer on the recess of the wafer-supporting arm 30. The arm 20 and the scrubbed silicon wafer then move toward the retracted position to return the wafer to the cassette 26. When this is completed, the cassette moves downwardly so that the next wafer in the cassette is in position to be transferred to the chuck 14 and to repeat the various processing cycles. Accordingly, the operation is repeated until each wafer within the cassette is transferred to the chuck for processing and then returned to the cassette. When the last wafer is returned to the cassette, indicating that all of the wafers have been processed, the completed cassette is then removed and replaced with a new cassette of wafers to be processed.

It should be understood that the term wafer used herein is intended to cover any thinly-sliced workpiece, such as a mask, substrate or silicon wafer. In addition, although the transferring apparatus has been illustrated using one cassette, it should be understood that the present invention may be employed with no cassettes, and the wafers may be deposited on the chuck in any manner. Additionally, the present invention also has applicability to arrangement having two cassettes, one for supplying wafers to be processed and the other cassette for receiving processed wafers. Further, although the baking operation has been illustrated utilizing a microwave chamber, it should be understood that other types of heating apparatus may be employed, such as hot air, heat lamps, etc.

A latitude of modification, change, and substitution is intended in the foregoing disclosure, and in some instances, some features of the invention will be employed without a corresponding use of other features. Accordingly, it is appropriate that the appended claims be construed broadly and in a manner consistent with the spirit and scope of the invention herein.

What is claimed is:

1. In a method of processing a substrate which is useful in the manufacture of semiconductor devices, said process including one or more non-baking steps, such as scrubbing, coating, developing, rinsing or drying, and a baking step, the improvement wherein all of said non-baking and baking steps are carried out at a single work station, said improvement further comprising the steps of providing said substrate on a work support which is located at said work station and selectively and sequentially performing at least one of said non-baking steps and said baking step on said substrate while said substrate is continuously maintained on said work support, whereby said baking step may be performed before or after one or more of said non-baking steps or between two or more of said non-baking steps.

2. The method of claim 1, wherein said non-baking steps include depositing said substrate on said work support, moving a scrubbing head into position over said work support, scrubbing said substrate while said substrate is on said work support, and retracting said scrubbing head from over said work support.

3. The method of claim 2, wherein said non-baking steps further include moving a dispenser into position over said work support;
dispensing a liquid onto said substrate while said substrate is on said work support;
retracting said dispenser from over said work support; and
baking said substrate while said substrate is maintained on said work support.

4. The method of claim 1, wherein said baking step includes surrounding said work support and said substrate with a microwave chamber to bake said substrate.

5. The method of claim 1, wherein the step of providing said substrate on work support includes transferring said substrate to said work support from a cassette positioned adjacent to said work support.

6. The method of claim 3, further including the non-baking step of spinning said work support to dry said substrate before performing said baking step.

7. The method of claim 1, wherein said baking step includes rotating said work support during the baking of said substrate.

8. The method of claim 1, wherein said substrate is a silicon wafer useful in the manufacture of integrated circuits.

9. Apparatus for processing a substrate which is useful in the manufacture of semiconductor devices, said apparatus performing one or more non-baking steps, such as scrubbing, coating, developing, rinsing or drying, and a baking step, the improvement wherein all of said non-baking and baking steps are carried out at a single work station, said improvement further comprising a work support provided at said work station and performing means for selectively and sequentially performing at least one of said non-baking steps and said baking step on said substrate while said substrate is continuously maintained on said work support, whereby said baking step may be performed before or after one or more of said non-baking steps or between two or more of said non-baking steps.

10. Apparatus in accordance with claim 9, wherein said performing means includes heating means and said work support is positioned in said heating means.

11. Apparatus in accordance with claim 10, wherein said performing means includes processing means movably positioned over said work support for performing a processing operation on said substrate and first moving means for moving said processing means from over said work support.

12. Apparatus according to claim 11, wherein said heating means is a microwave chamber.

13. Apparatus in accordance with claim 12, wherein:
said microwave chamber includes two relatively movable sections for opening and closing said microwave chamber so that said processing means can be moved into and out of position over said work support.

14. Apparatus in accordance with claim 13, wherein said processing means includes a movable scrubbing head positioned adjacent to said work support and second moving means for moving said scrubbing head into position over said work support.

15. Apparatus in accordance with claim 14, wherein said scrubbing head includes a rotating brush for scrubbing said substrate.

16. Apparatus in accordance with claim 13, wherein said processing means includes movable dispensing means positioned adjacent to said work support for dispensing fluid on said substrate while said substrate is on said work support.

17. Apparatus in accordance with claim 16, further including third moving means for moving said dispensing means between a retracted position and an extended position over said work support.

18. Apparatus in accordance with claim 9, wherein said providing means deposits said substrate on said work support and removes said substrate therefrom.

19. Apparatus in accordance with claim 9, wherein said providing means includes receiving means for receiving a cassette of substrates to be processed and transferring means for transferring each substrate to be processed from said cassette to said work support and for returning said processed substrate to said cassette.

20. Apparatus in accordance with claim 9, wherein said providing means includes first receiving means for receiving a first cassette of substrates and second receiving means for receiving a second empty cassette, and transferring means for transferring each substrate to be processed from said first cassette to said work support and for transferring said processed substrate from said work support to said second cassette.

21. Apparatus in accordance with claim 9, wherein said baking means includes rotating means for rotating said work support.

22. Apparatus according to claim 9, wherein said substrate is a silicon wafer useful in the manufacture of integrated circuits.

* * * * *